United States Patent
Lin et al.

(10) Patent No.: US 11,280,821 B2
(45) Date of Patent: Mar. 22, 2022

(54) COMPACT ANECHOIC CHAMBER FOR ACTIVE AND PASSIVE ANTENNA OVER-THE-AIR TESTING

(71) Applicant: Jabil Inc., St. Petersburg, FL (US)

(72) Inventors: Lin Lin, St. Petersburg, FL (US); Kevin Loughran, St. Petersburg, FL (US); Jason A. Wildt, St. Petersburg, FL (US)

(73) Assignee: JABIL INC., St. Petersburg, FL (US)

( * ) Notice: Subject to any disclaimer, the term of this patent is extended or adjusted under 35 U.S.C. 154(b) by 426 days.

(21) Appl. No.: 16/362,226

(22) Filed: Mar. 22, 2019

(65) Prior Publication Data

US 2020/0081049 A1 Mar. 12, 2020

Related U.S. Application Data

(60) Provisional application No. 62/729,732, filed on Sep. 11, 2018.

(51) Int. Cl.
| | |
|---|---|
| *G01R 29/10* | (2006.01) |
| *H04B 17/16* | (2015.01) |
| *G01R 29/08* | (2006.01) |
| *H04B 17/391* | (2015.01) |

(52) U.S. Cl.
CPC ....... *G01R 29/105* (2013.01); *G01R 29/0821* (2013.01); *H04B 17/16* (2015.01); *H04B 17/391* (2015.01)

(58) Field of Classification Search
CPC ...... H04B 17/16; H04B 17/39; G01R 29/105; G01R 29/0821
USPC .......................................................... 343/703
See application file for complete search history.

(56) References Cited

U.S. PATENT DOCUMENTS

| | | | |
|---|---|---|---|
| 2011/0270567 A1* | 11/2011 | Mow ................... | H04B 17/0087 702/120 |
| 2014/0161164 A1* | 6/2014 | Emmanuel ........... | H04B 5/0043 375/224 |

FOREIGN PATENT DOCUMENTS

| | | | |
|---|---|---|---|
| CN | 102589678 | * | 7/2012 |
| CN | 204044363 | * | 12/2014 |

* cited by examiner

*Primary Examiner* — Andrea Lindgren Baltzell
(74) *Attorney, Agent, or Firm* — Thomas J. McWilliams; Barnes & Thornburg LLP

(57) ABSTRACT

The disclosed exemplary apparatuses, systems and methods provide at least a compact anechoic chamber for over-the-air antenna testing, which may include at least: a chamber housing; an interchangeable irradiating test panel, integral to the chamber; a plurality of absorbing material at least partially lining an interior of the chamber and capable of directing the irradiating; at least one moveable cart suitable for moving and removing the antenna within and from the chamber; and at least one panel interface for interconnecting the antenna and equipment for the testing, wherein a response of the antenna to the irradiating is communicated through the panel interface to the testing equipment.

20 Claims, 9 Drawing Sheets

COMPACT ANECHOIC CHAMBER FOR ACTIVE AND PASSIVE ANTENNA OVER-THE-AIR TESTING

CROSS-REFERENCE TO RELATED APPLICATION

This application claims the benefit of priority to U.S. Provisional Application No. 62/729,732, field Sep. 11, 2018, entitled COMPACT ANECHOIC CHAMBER FOR ACTIVE AND PASSIVE ANTENNA OVER-THE-AIR TESTING, the entirety of which is incorporated herein by reference as if set forth in its entirety.

BACKGROUND

Field of the Disclosure

The present disclosure relates to antenna testing, and, more specifically, to an apparatus, system and method for active and passive antenna over-the-air testing.

Description of the Background

A remote radio head (RRH) in wireless networks is a remote radio transceiver that connects to an operator radio control panel, such as via a wireless interface, such as a passive antenna. In wireless systems, such as GSM/CDMA, UMTS, LTE, and 5G New Radio (NR) systems, the RRH equipment is remote to the base transceiver station (BTS)/NodeB/eNodeB, respectively. The BTS/NodeB/eNodeB (hereinafter collectively "BTS") is a piece of equipment that facilitates wireless communication between user equipment and the respective wireless network. The RRH equipment is used to extend the coverage of the BTS.

RRHs are vital subsystems of many current, distributed BTSs. The RRH contains the BTS's RF circuitry, analog-to-digital/digital-to-analog converters, up/down converters, operation and management processing capabilities, and standardized interfaces, among various other aspects.

An active antenna system (AAS) is an antenna that contains active electronic components, as compared to most antennas used in wireless networks, which are passive. AASs allow antennas of limited size to have a specific frequency range (i.e., bandwidth) and pattern as compared to passive antennas.

Beamforming for antennas may be provided for by an active antenna component. The active component(s) may include at least an impedance translating stage and an optional amplification stage, for example.

The wireless industry has been moving from RRH to AAS in recent times. For example, in December of 2017, the 3GPP standards body released an official AAS standard. The differences between typical RRH and AAS antenna systems are illustrated with respect to FIG. 1.

SUMMARY

The disclosed exemplary apparatuses, systems and methods provide at least a compact anechoic chamber for over-the-air antenna testing, which may include at least: a chamber housing; an interchangeable irradiating test panel, integral to the chamber; a plurality of absorbing materials covering the entire interior of the chamber and capable of directing the irradiating; at least one moveable cart suitable for moving and removing the antenna within and from the chamber; and at least one panel interface for interconnecting the antenna and equipment for the testing, wherein a response of the antenna to the irradiating is communicated through the panel interface to the testing equipment.

BRIEF DESCRIPTION OF THE DRAWINGS

The disclosed non-limiting embodiments are discussed in relation to the drawings appended hereto and forming part hereof, wherein like numerals indicate like elements, and in which.

DETAILED DESCRIPTION

Figure 1:
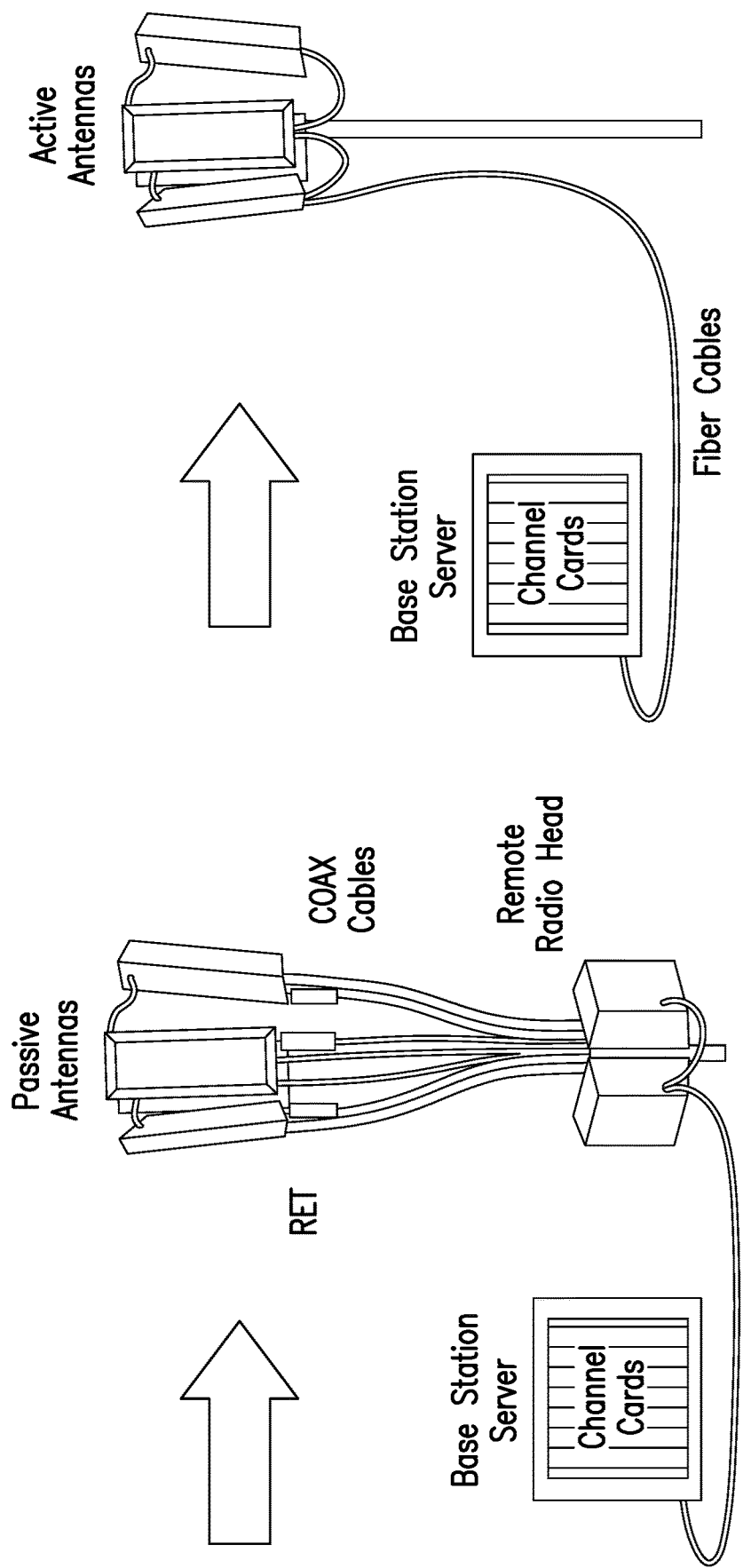
FIG. 1 is an illustration of aspects of the embodiments.

The figures and descriptions provided herein may have been simplified to illustrate aspects that are relevant for a clear understanding of the herein described apparatuses, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, for the sake of brevity a discussion of such elements and operations may not be provided herein. However, the present disclosure is deemed to nevertheless include all such elements, variations, and modifications to the described aspects that would be known to those of ordinary skill in the art.

Embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that certain specific disclosed details need not be employed, and that embodiments may be embodied in different forms. As such, the embodiments should not be construed to limit the scope of the disclosure. As referenced above, in some embodiments, well-known processes, well-known device structures, and well-known technologies may not be described in detail.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

When an element or layer is referred to as being "on", "engaged to", "connected to" or "coupled to" another element or layer, it may be directly on, engaged, connected or coupled to the other element or layer, or intervening elements or layers may be present, unless clearly indicated otherwise. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). Further, as used herein the term "and/or" includes any and all combinations of one or more of the associated listed items.

Yet further, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the embodiments.

Figure 2:
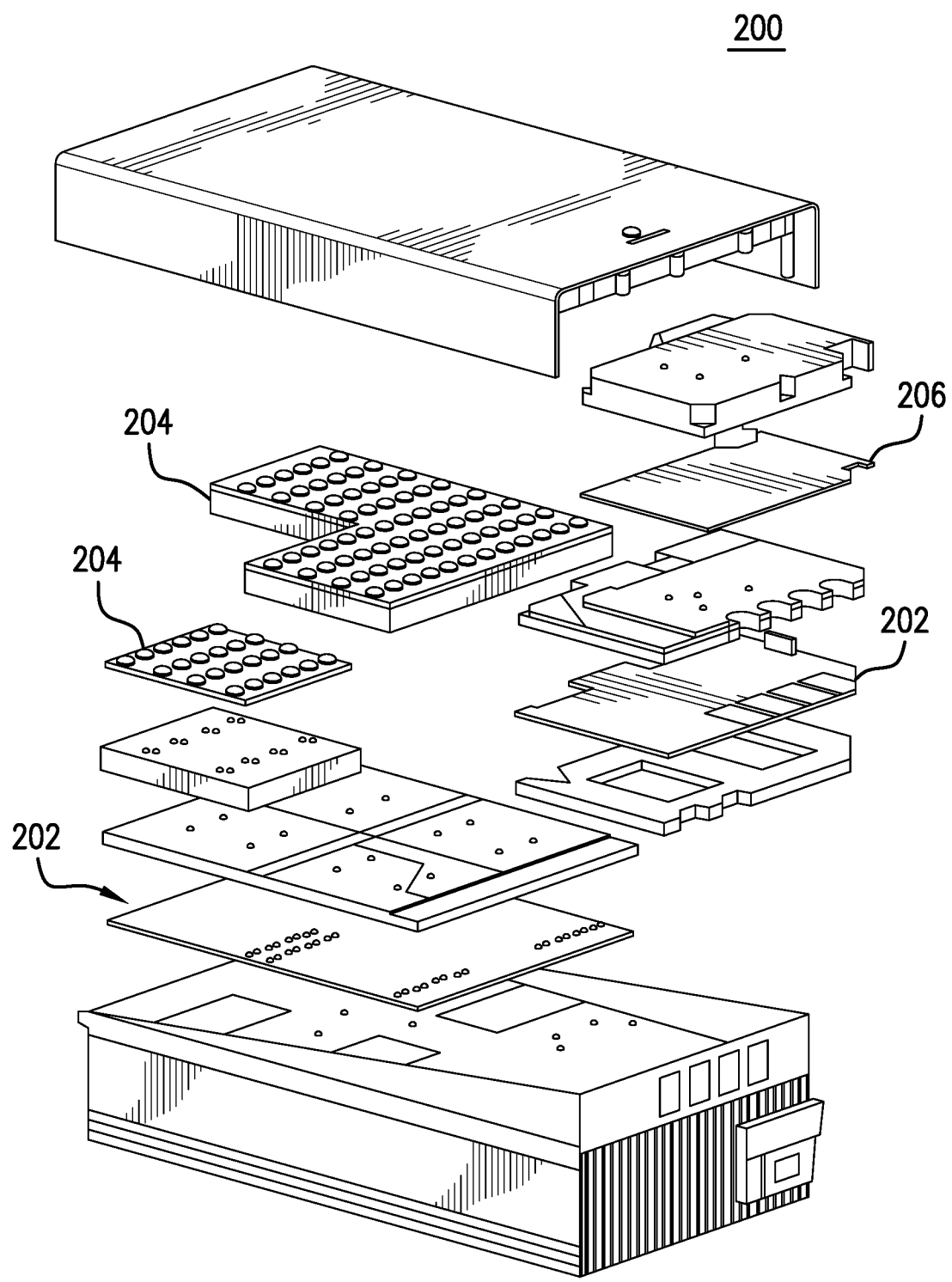
FIG. 2 is an illustration of aspects of the embodiments.

As indicated above, AASs have greater complexity than RRH systems and similar systems using passive antennas. For example, an AAS: may have 10-20 times more transmit/receive paths than a RRH; may include an integrated lower physical layer design, with decision-feedback equalization for cellular radio channels, and a radio and antennae in a single unit—all of which requires complex soldering and assembly; necessitates the use of large printed circuit boards (PCBs); requires the testing of antenna radiation and beam-forming patterns; uses significant supplied power; and requires calibration for particular use cases. Several of these complexities are illustrated with respect to PCB 202, antenna 204, and power supply 206 in a typical AAS 200, in relation to FIG. 2. However, although AAS is employed in recently finalized antenna specifications for 5G and 3GPP, as referenced above, there is no present solution to readily test the many complexities unique to AAS, as mentioned above, particularly for high volume production.

Over-the-air (OTA) testing of an antenna is designed to test an antenna's radiation properties through the air. Although for most wireless communication applications, such as those used in a BTS, the far-field properties of the antenna are of most significant interest, it is typical, for the sake of cost and efficiency, that many of the complexities referenced above are tested in the near field, and the far-field properties are merely derived and approximated from the near field test data. This is due, in large measure, to the aforementioned lack of suitable far-field testing systems.

More specifically, the testing of far-field antenna properties in the known art requires a chamber approximately 10 times larger than a near-filed chamber, and approximately 10 times larger than the far-field test chamber disclosed in the instant embodiments. This footprint alone may make such testing inoperable in high speed radio-product manufacturing lines using the known art, a disadvantage remedied in the embodiments.

Moreover, to the extent available, more compact test chambers in the known art are generally include only one or a very few measurement probes. As will be appreciated by the skilled artisan, testing in such a compact chamber of the known art is thus very slow, highly inadequate as to a number of test characteristics, insufficient to gauge most of the aforementioned complexities in far-field characteristics, and requires manual movement of antenna under test.

In short, the combination of unwieldy size, and/or inadequacies in the available test probes, makes the prior art testing of active antennas very substandard. The present disclosure provides a probe array that not only allows for a far more compact size than is available in the known art, but which also enables probing of the antenna under test for a much greater number of characteristics than are available in the known art. In short, the presently disclosed embodiments thus make available antenna testing in many circumstances in which such testing was not previously available.

More particularly, due to the aforementioned inadequacies of available testing, antenna system manufacturers often altogether avoid testing an antenna's OTA performance during production. Needless to say, this creates a high likelihood of antenna failure, or at least an unacceptably poor performance, upon installation, particularly in unique use circumstances and environments. This, of course, enhances the possibility of costly product recalls and/or removals and replacements after deployment.

Figure 3:
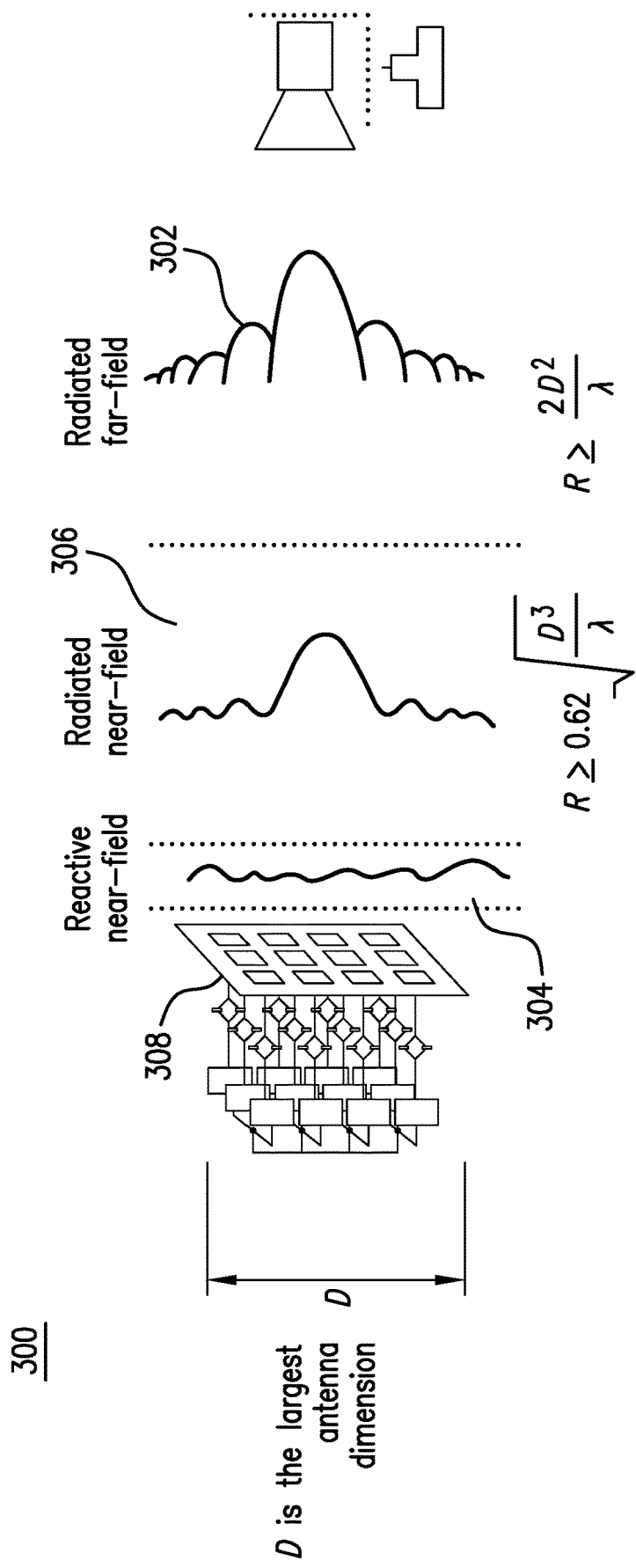
FIG. 3 is an illustration of aspects of the embodiments.

FIG. 3 illustrates the relationship of the far-field 302 and the reactive 304 and radiated near-field 306 for the illustrated AAS antenna array 308 having largest dimension D. In relation to the illustration of FIG. 3, $\lambda=c/f$ is the wave length of the transmitting/receiving signal of the antenna, and R is the radiated field.

More specifically, the embodiments provide a test chamber, such as a compact anechoic test chamber, suitable to test at least the aforementioned aspects of both AAS and passive antennas in a test frequency range of about 1.8 Ghz-6 Ghz. The embodiments include at least a near-field and far-field test chamber that is small enough in overall footprint to allow for the installation of multiple sets along a regular radio-product manufacturing line.

By way of example, the testing provided in the disclosed test chamber may include: anechoic radiation and beam-forming test coverage for: 3D far-field patterns (co- and cross-polar); directivity; half-power beamwidth; boresight direction; peak sidelobe level distribution and RMS sidelobe level; spurious signal generation; switching time scanned beam; and effective radiated power (ERP). The test chamber may include thus multiple probes suitable to test the aforementioned aspects, and these multiple probes may be organized in an array and linked to a multi-channel instrument platform (such as an arbitrary waveform generator, a spectrum analyzer, and/or a network analyzer, by way of example).

The test chamber may comprise, for example, a planar or a cylindrical testing array composition. More specifically, the chamber may be sized and shaped so as to accommodate one or more mechanisms to move an antenna under test (AUT) having characteristics of a weight of up to or more than 100 Kg, and size within the dimension of about 1.5 m×0.8 m×0.3 m, in and out of the chamber for testing. Mechanisms may further be optionally included to lock the relative position between the AUT and the applied multi-channel probes referenced above.

Figure 4:
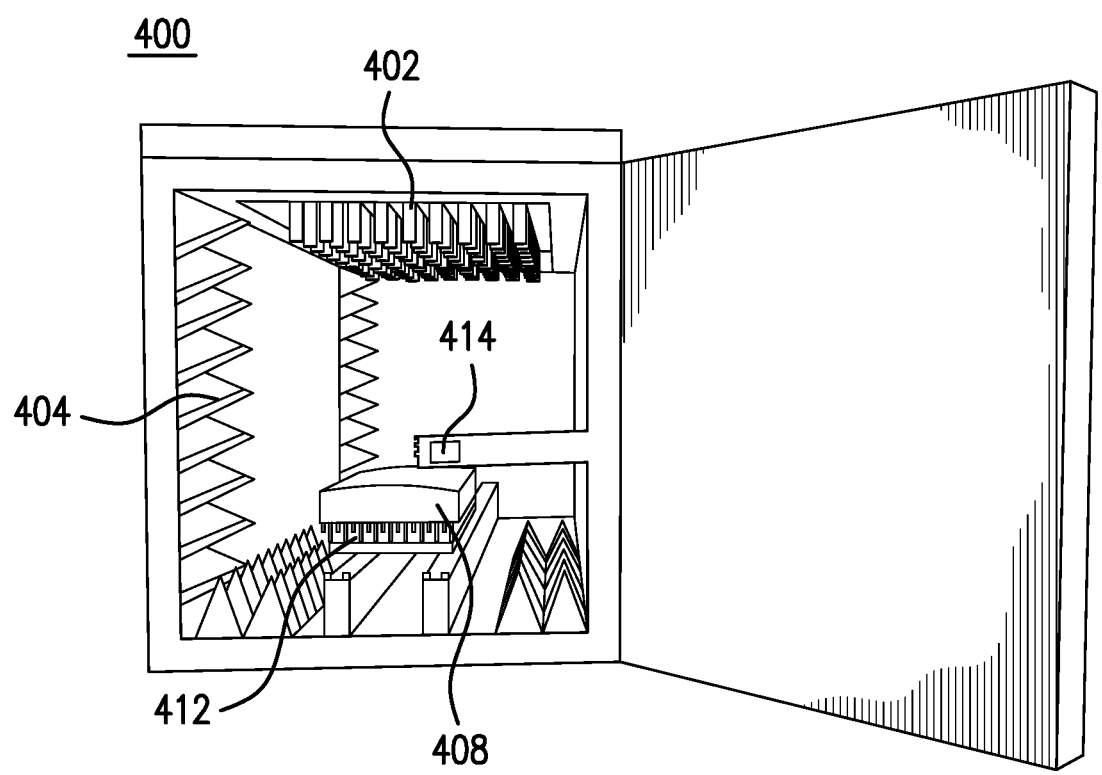
FIG. 4 is an illustration of aspects of the embodiments.

FIG. 4 illustrates a side view of an exemplary test chamber 400 having a planar probe array 402 in the embodiments. The chamber's internal walls may be covered with RF absorbing material 404 to provide the aforementioned anechoic effects. The RF signal probes illustrated are arranged in a 2D probe array 402, which array may be larger than the AUT 408 to allow for testing over the full physical range of the AUT 408.

The AUT 408 may reside on a cart 410 that is slid into and out of the chamber 400 on at least two cart rails 412. This allows for optimal physical placement of the AUT 408 under the probe array, such as wherein certain aspects of the probe array are used to test certain aspects of the AUT 408, or wherein the physical size of the antenna is greater than the length of the probe array. Thus, for example, the AUT 408 may be moved in and out atop the cart 410 along the cart rail 412, such as manually or automatically (such as via a mechanically actuated drive-wire responsive to the control system discussed herein), and may be locked at a fixed position easily and accurately, also manually or automatically.

Further, a cable slot/interface 414 allows for the cabling of the antenna 408 to run out of the chamber 400 to external test equipment, or may allow for permanent attachment of the test equipment cabling to the chamber. Thereafter, the cabling of the antenna 408 may be simplistically associated with the test equipment, such as through via "plug and play" using a plurality of ports within the chamber which are part of the cable slot 414 illustrated.

As will be appreciated, the movement of the cart along the rails, the actuation of the probe array or aspects thereof, and/or the monitoring of the cable slot 414 test data may be carried out by one or more software control programs 1190, such as may be under the control of one or more control systems 1100, as discussed herein below. The control system 1190 may store or otherwise send data locally or remotely for accumulation and/or subsequent performance assessments, as will be understood to the skilled artisan.

Figure 5:
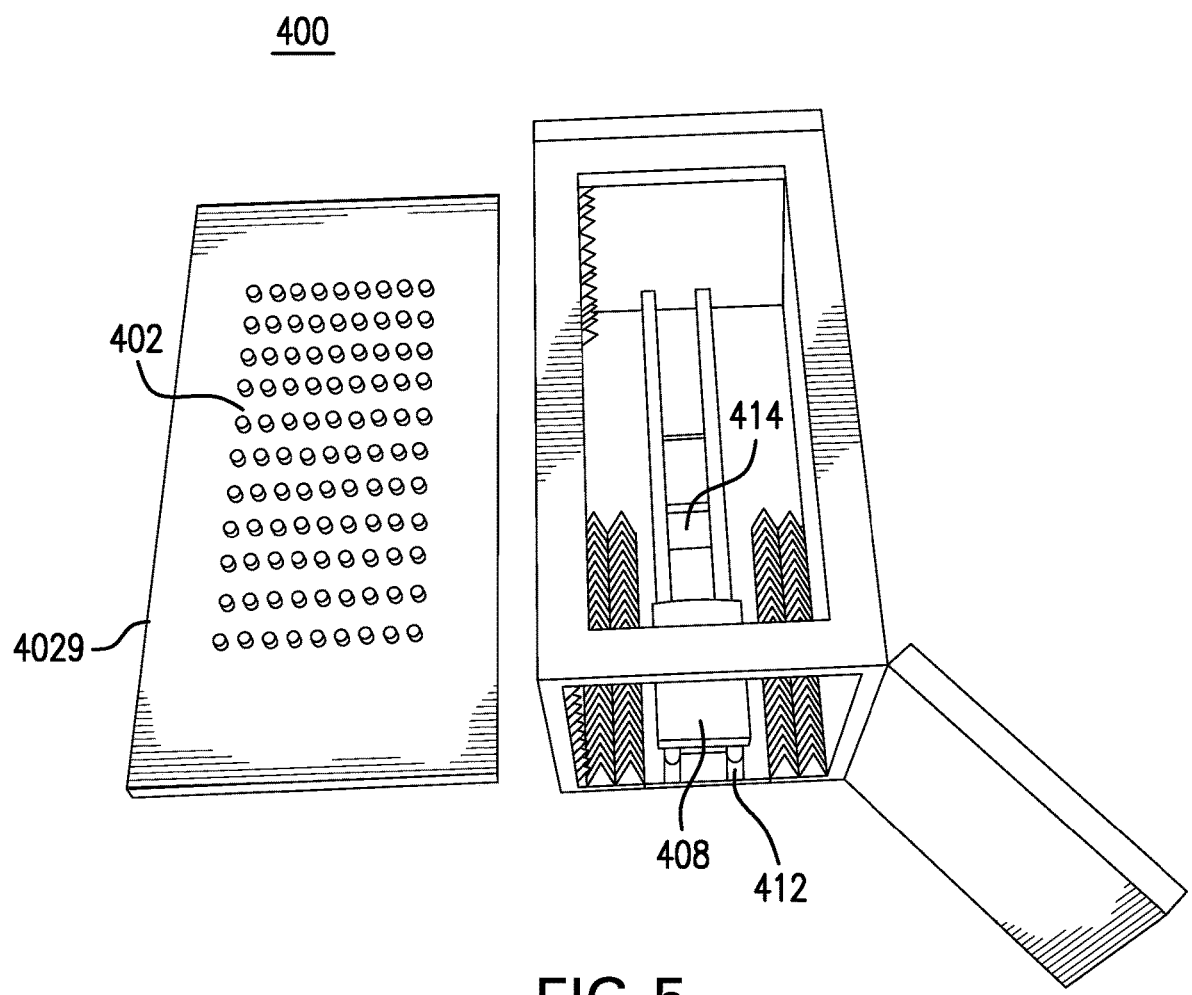
FIG. 5 is an illustration of aspects of the embodiments.

FIG. 5 illustrates a top view of a planar test chamber 400 embodiment. As shown, the probe array may 402 comprise a panel 402a that is removable. Accordingly, alternative probe array panels 402a having varying probes thereon may be switched in and out of the chamber 400, such as to suitably test various different antennas 408, such as by each having differing probe spacing on the probe panel for different size AUTs 408, by way of non-limiting example.

Figure 6:
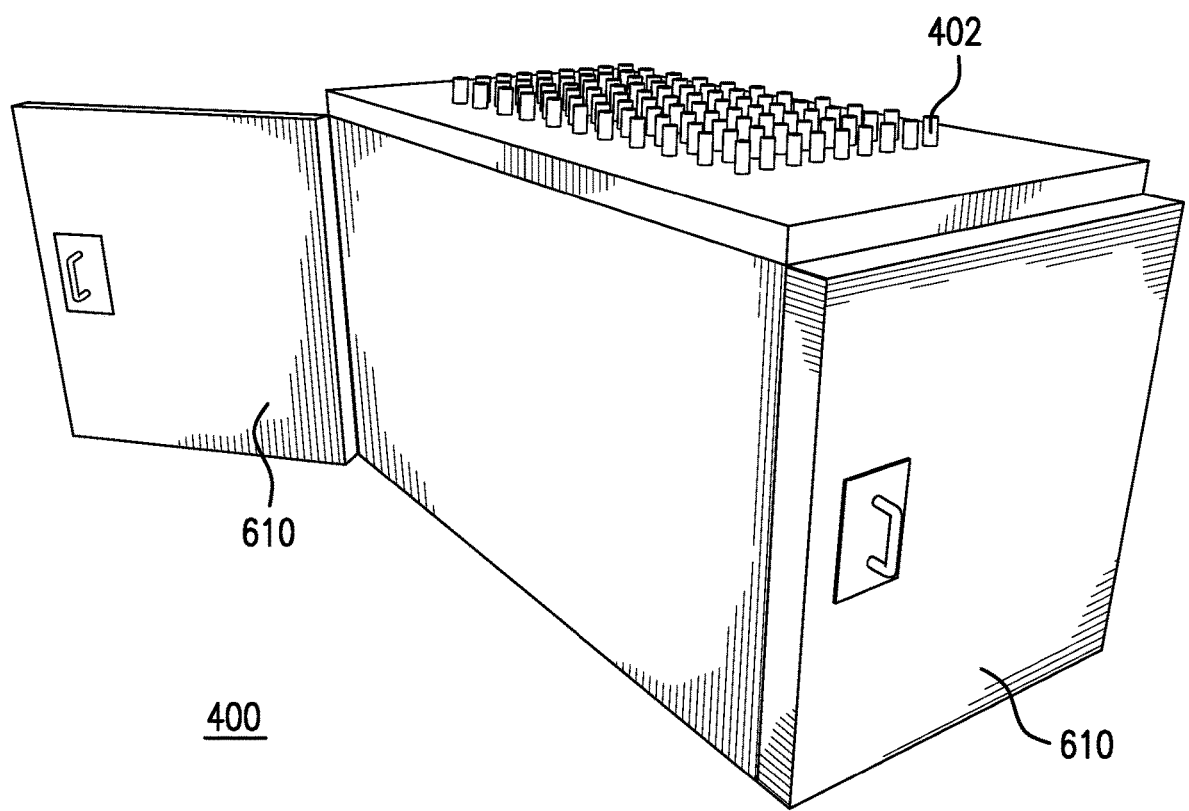
FIG. 6 is an illustration of aspects of the embodiments.

FIG. 6 illustrates a back side view of a planar test chamber 400 embodiment. Of note, although the movement and locking of the AUT cart 410 (and/or the AUT 408 itself) may be automatic or manual, as discussed above, doors 610 may be included at either or both ends of the chamber 400, as illustrated. These doors 610 may allow for easy access to, and of the loading/unloading of, the AUT 408, and/or access to the circuitry, including the panel/cable slot 414, inside the chamber.

Figure 7:
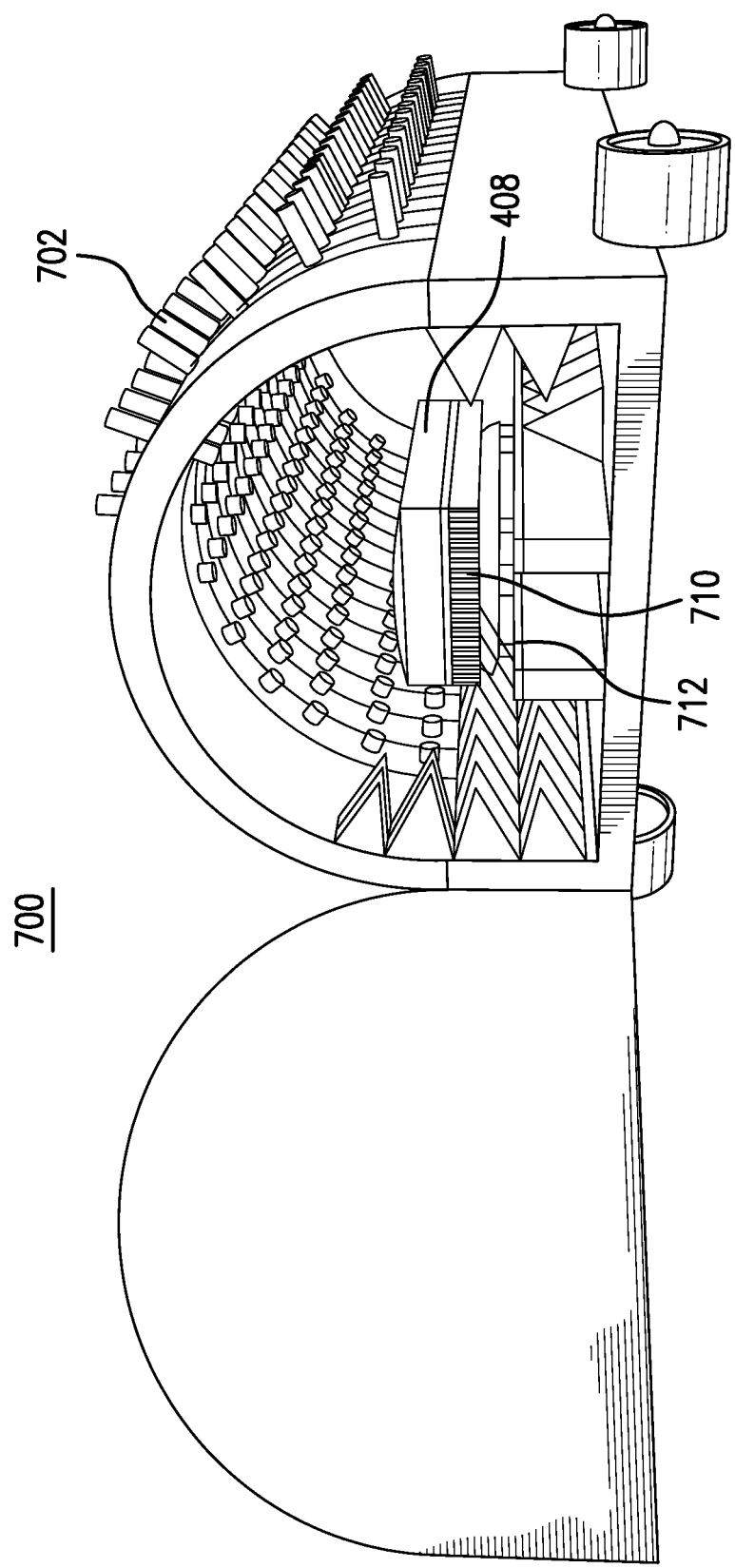
FIG. 7 is an illustration of aspects of the embodiments.

FIG. 7 is an illustration of a cylindrical test chamber 700 according to the exemplary embodiments. As shown in FIG. 7, a cylindrical test chamber 700 may also provide a cart 710 and cart rails 712, such as may have various stops, for an AUT 408, but may have a probe array 702 in a semi-circular/spherical/cylindrical format about the AUT 408. A cylindrical test chamber 700 may allow for testing of the AUT 700 over a wide range of characteristics and frequencies, and with high anechoic accuracy.

Figure 8:
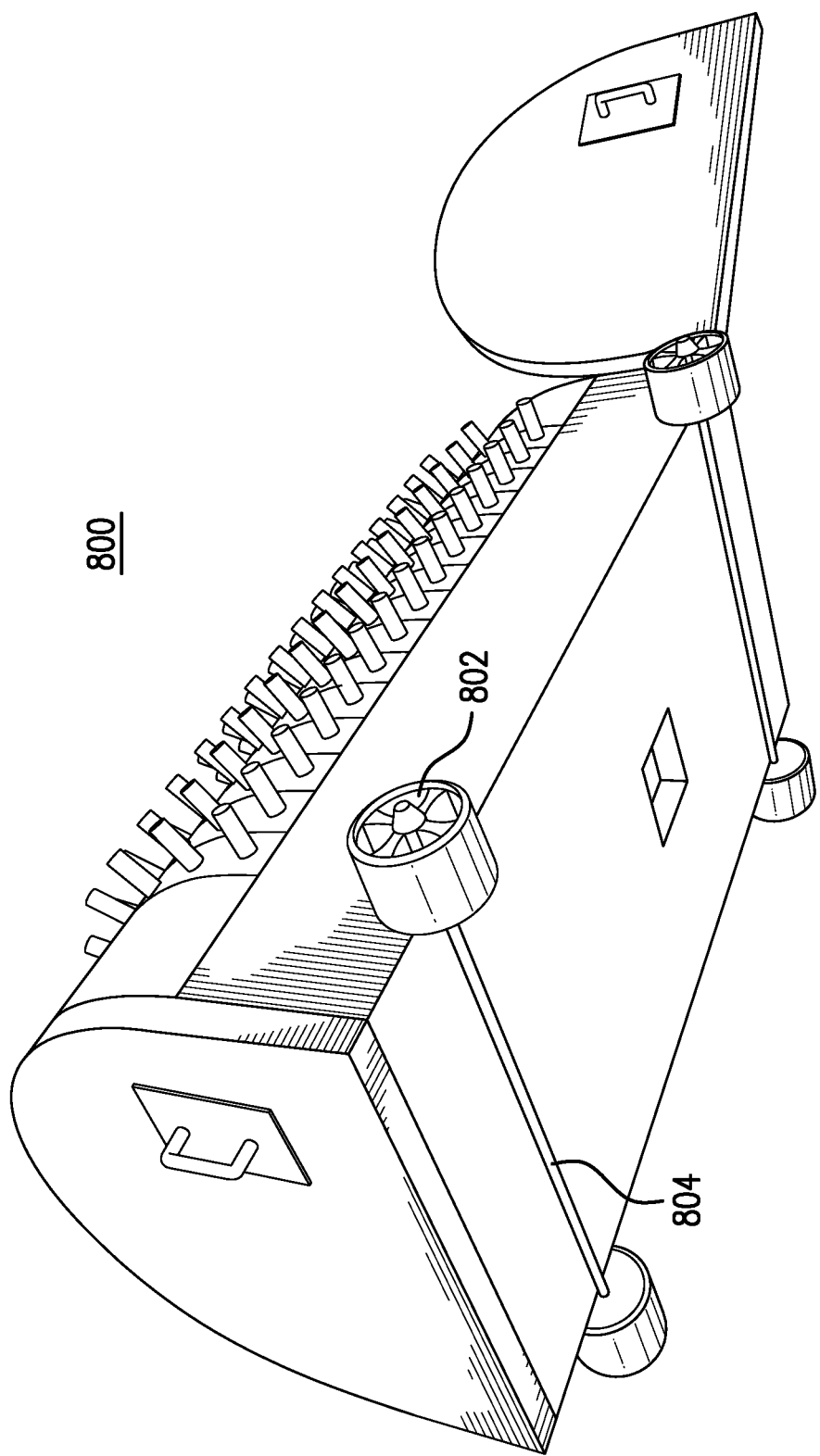
FIG. 8 is an illustration of aspects of the embodiments.

FIG. 8 illustrates that a test chamber 800 according to the embodiments may be mobile. That is, the test chamber may include wheels 802 and wheel axles 804 associated therewith, such as at a lower portion thereof.

Figure 9:
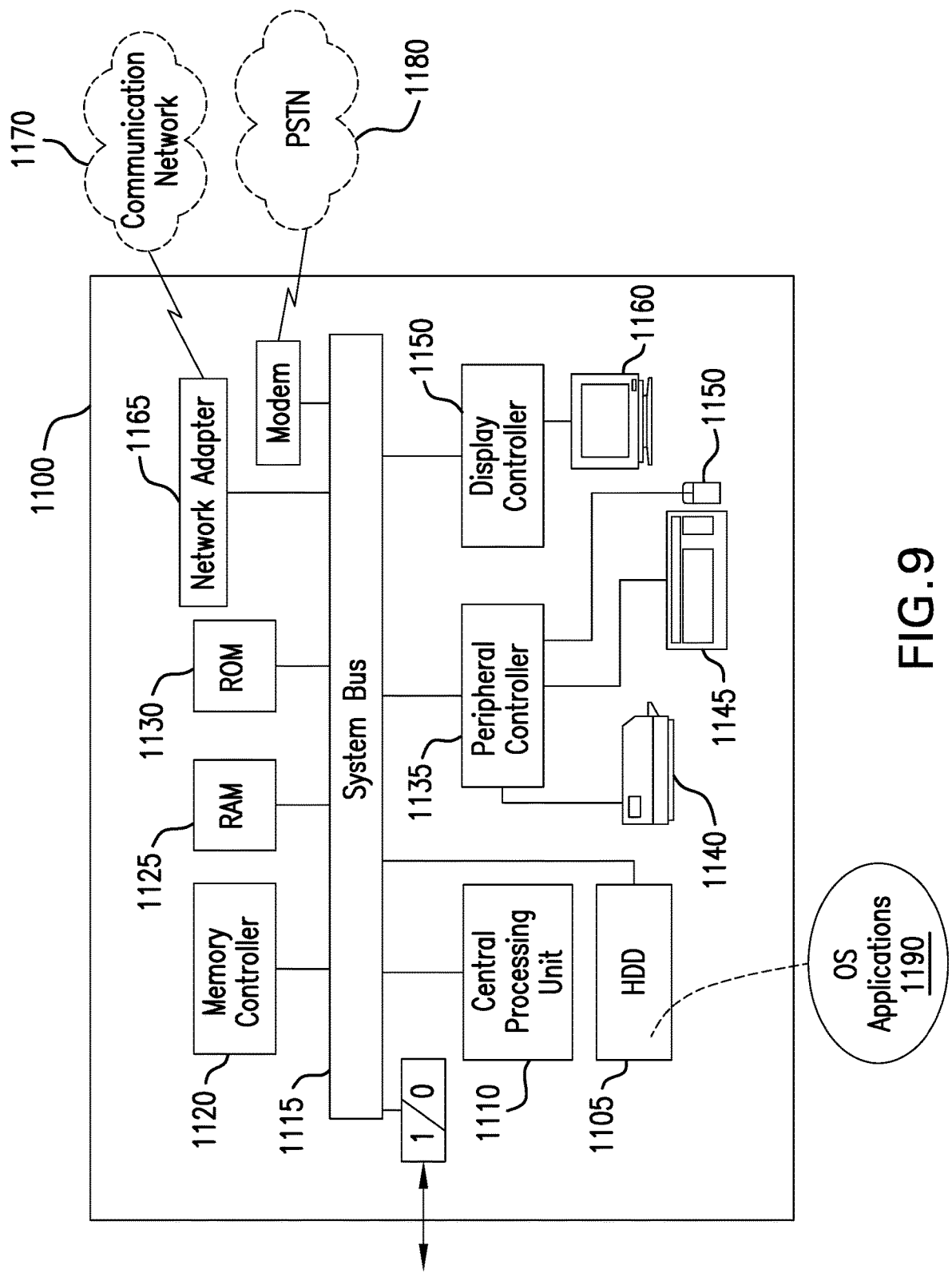
FIG. 9 illustrates an exemplary computing system.

FIG. 9 depicts an exemplary computing system 1100 for use in association with the herein described systems and methods. Computing system 1100 is capable of executing software, such as an operating system (OS) and/or one or more computing applications/algorithms 1190, such as applications executing and applying the testing algorithms discussed herein, and may execute such applications 1190 using data, such as materials and process-related data, which may be stored 1115 locally or remotely.

More particularly, the operation of an exemplary computing system 1100 is controlled primarily by the algorithm 1190 comprised of computer readable instructions, such as instructions stored in a computer readable storage medium, such as hard disk drive (HDD) 1115, optical disk (not shown) such as a CD or DVD, solid state drive (not shown) such as a USB "thumb drive," or the like. Such instructions may be executed within central processing unit (CPU) 1110 to cause computing system 1100 to perform the operations discussed throughout. In many known computer servers, workstations, personal computers, and the like, CPU 1110 is implemented in an integrated circuit called a processor.

It is appreciated that, although exemplary computing system 1100 is shown to comprise a single CPU 1110, such description is merely illustrative, as computing system 1100 may comprise a plurality of CPUs 1110. Additionally, computing system 1100 may exploit the resources of remote CPUs (not shown), for example, through communications network 1170 or some other data communications means.

In operation, CPU 1110 fetches, decodes, and executes instructions from a computer readable storage medium, such as HDD 1115. Such instructions may be included in software, such as an operating system (OS), executable programs such as the aforementioned correlation applications, and the like. Information, such as computer instructions and other computer readable data, is transferred between components of computing system 1100 via the system's main data-transfer path. The main data-transfer path may use a system bus architecture 1105, although other computer architectures (not shown) can be used, such as architectures using serializers and deserializers and crossbar switches to communicate data between devices over serial communication paths. System bus 1105 may include data lines for sending data, address lines for sending addresses, and control lines for sending interrupts and for operating the system bus. Some busses provide bus arbitration that regulates access to the bus by extension cards, controllers, and CPU 1110.

Memory devices coupled to system bus 1105 may include random access memory (RAM) 1125 and/or read only memory (ROM) 1130. Such memories include circuitry that allows information to be stored and retrieved. ROMs 1130 generally contain stored data that cannot be modified. Data stored in RAM 1125 can be read or changed by CPU 1110 or other hardware devices. Access to RAM 1125 and/or ROM 1130 may be controlled by memory controller 1120. Memory controller 1120 may provide an address translation function that translates virtual addresses into physical addresses as instructions are executed. Memory controller 1120 may also provide a memory protection function that isolates processes within the system and isolates system processes from user processes. Thus, a program running in user mode may normally access only memory mapped by its own process virtual address space; in such instances, the program cannot access memory within another process' virtual address space unless memory sharing between the processes has been set up.

In addition, computing system 1100 may contain peripheral communications bus 1135, which is responsible for communicating instructions from CPU 1110 to, and/or receiving data from, peripherals, such as peripherals 1140, 1145, and 1150, which may include printers, keyboards, and/or the sensors discussed herein throughout. An example of a peripheral bus is the Peripheral Component Interconnect (PCI) bus.

Display 1160, which is controlled by display controller 1155, may be used to display visual output and/or other presentations generated by or at the request of computing system 1100, such as in the form of a GUI, responsive to operation of the aforementioned computing program(s). Such visual output may include text, graphics, animated graphics, and/or video, for example. Display 1160 may be implemented with a CRT-based video display, an LCD or LED-based display, a gas plasma-based flat-panel display, a touch-panel display, or the like. Display controller 1155 includes electronic components required to generate a video signal that is sent to display 1160.

Further, computing system 1100 may contain network adapter 1165 which may be used to couple computing system 1100 to external communication network 1170, which may include or provide access to the Internet, an intranet, an extranet, or the like. Communications network 1170 may provide user access for computing system 1100 with means of communicating and transferring software and information electronically. Additionally, communications network 1170 may provide for distributed processing, which involves several computers and the sharing of workloads or cooperative efforts in performing a task. It is appreciated that the network connections shown are exemplary and other means of establishing communications links between computing system 1100 and remote users may be used.

Network adaptor 1165 may communicate to and from network 1170 using any available wired or wireless technologies. Such technologies may include, by way of non-limiting example, cellular, Wi-Fi, Bluetooth, infrared, or the like.

It is appreciated that exemplary computing system 1100 is merely illustrative of a computing environment in which the herein described systems and methods may operate, and does not limit the implementation of the herein described systems and methods in computing environments having differing components and configurations. That is to say, the inventive concepts described herein may be implemented in various computing environments using various components and configurations.

In the foregoing detailed description, it may be that various features are grouped together in individual embodiments for the purpose of brevity in the disclosure. This method of disclosure is not to be interpreted as reflecting an intention that any subsequently claimed embodiments require more features than are expressly recited.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather is to be accorded the widest scope consistent with the principles and novel features disclosed herein.

What is claimed is:

1. A compact anechoic chamber for over-the-air antenna testing, comprising:
    a chamber housing;
    a removably interchangeable irradiating test array, integral to the chamber housing;
    a plurality of absorbing material completely lining an interior of the chamber housing and capable of directing irradiating from the removably interchangeable irradiating test array;
    at least one moveable cart suitable for moving and removing the antenna from the chamber housing;
    at least one locking mechanism suitable to lock a relative position between the antenna and the removably interchangeable irradiating test array; and
    at least one panel interface for interconnecting the over-the-air antenna and testing equipment outside the chamber housing, wherein a response of the over-the-air antenna to the irradiating is communicated through the panel interface to the testing equipment.

2. The compact anechoic chamber of claim 1, wherein the chamber housing comprises a flat upper inner surface, and the removably interchangeable irradiating test array is conformed to the flat upper inner surface.

3. The compact anechoic chamber of claim 1, wherein the chamber housing comprises a curved upper inner surface, and the removably interchangeable irradiating test array is conformed to the curved upper inner surface.

4. The compact anechoic chamber of claim 1, wherein the interchangeable aspects of the test array comprise size variations of the removably interchangeable irradiating test array.

5. The compact anechoic chamber of claim 1, wherein the interchangeable aspects of the removably interchangeable irradiating test array comprise variations in characteristics of the irradiation.

6. The compact anechoic chamber of claim 1, wherein the absorbing material comprises anechoic material.

7. The compact anechoic chamber of claim 1, wherein a physical width of the removably interchangeable irradiating test array is corresponded to a width of the over-the-air antenna.

8. The compact anechoic chamber of claim 1, wherein a physical length of the removably interchangeable irradiating test array is corresponded to a length of the over-the-air antenna.

9. The compact anechoic chamber of claim 1, wherein the testing comprises near-field pattern testing.

10. The compact anechoic chamber of claim 1, wherein the testing comprises far-field pattern testing.

11. The compact anechoic chamber of claim 1, wherein the at least one moveable cart further comprises cart rails.

12. The compact anechoic chamber of claim 11, wherein moving of the at least one moveable cart along the cart rails is automated.

13. The compact anechoic chamber of claim 12, wherein the automated movement comprises an actuated drive-wire that pulls the at least one movable cart.

14. The compact anechoic chamber of claim 11, wherein moving of the at least one moveable cart along the cart rails is manual.

15. The compact anechoic chamber of claim 1, wherein the panel interface comprises a socket within the chamber housing.

16. The compact anechoic chamber of claim 15, wherein the socket comprises a plug and play socket for receiving data from the over-the-air antenna.

17. The compact anechoic chamber of claim 16, wherein the plug and play socket is proprietary.

18. The compact anechoic chamber of claim 1, wherein the testing equipment further comprises at least one computing control system.

19. The compact anechoic chamber of claim 18, wherein the control system further comprises a control algorithm for actuating the removably interchangeable irradiating test array.

20. The compact anechoic chamber of claim 1, wherein the testing equipment further comprises a proprietary socket for mating to a receiver on an exterior surface of the chamber housing.

* * * * *